United States Patent
Ulriksson

(10) Patent No.: US 7,788,572 B1
(45) Date of Patent: *Aug. 31, 2010

(54) PARALLEL MAXIMUM A POSTERIORI DETECTORS WITH FORWARD AND REVERSE VITERBI OPERATORS HAVING DIFFERENT CONVERGENCE LENGTHS ON A SAMPLED DATA SEQUENCE

(75) Inventor: Bengt Ulriksson, Milford, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 1164 days.

This patent is subject to a terminal disclaimer.

(21) Appl. No.: 11/409,684

(22) Filed: Apr. 24, 2006

Related U.S. Application Data

(60) Provisional application No. 60/723,131, filed on Oct. 3, 2005.

(51) Int. Cl.
    *H03M 13/03* (2006.01)
(52) U.S. Cl. .................. 714/795; 714/796; 375/341
(58) Field of Classification Search .................. 714/795, 714/796; 375/341
    See application file for complete search history.

(56) References Cited

U.S. PATENT DOCUMENTS

| | | | |
|---|---|---|---|
| 6,343,368 B1 * | 1/2002 | Lerzer | 714/796 |
| 6,707,624 B2 | 3/2004 | Erden et al. | |
| 6,757,122 B1 | 6/2004 | Kuznetsov et al. | |
| 6,791,995 B1 * | 9/2004 | Azenkot et al. | 370/436 |
| 6,871,316 B1 * | 3/2005 | Wong et al. | 714/796 |
| 7,116,732 B2 * | 10/2006 | Worm et al. | 375/341 |
| 7,555,070 B1 * | 6/2009 | Ulriksson et al. | 375/341 |
| 2004/0225949 A1 * | 11/2004 | Coombs et al. | 714/796 |
| 2004/0268208 A1 | 12/2004 | Radich | |
| 2005/0111375 A1 * | 5/2005 | Ravindran et al. | 370/252 |
| 2005/0135498 A1 * | 6/2005 | Yee | 375/267 |
| 2005/0169412 A1 | 8/2005 | Yang et al. | |
| 2005/0172204 A1 * | 8/2005 | Lin | 714/755 |
| 2005/0264922 A1 | 12/2005 | Erden et al. | |
| 2006/0002689 A1 | 1/2006 | Yang et al. | |
| 2006/0156171 A1 | 7/2006 | Kuznetsov et al. | |

\* cited by examiner

*Primary Examiner*—M. Mujtaba K Chaudry
(74) *Attorney, Agent, or Firm*—Kirk A. Cesari; Westman, Champlin & Kelly, P.A.

(57) ABSTRACT

A soft decision value output detector includes a plurality of maximum a posteriori (MAP) detectors. The MAP detectors are configured to simultaneously generate state metrics for portions of a sampled data sequence, and to generate soft decision values based on the generated state metrics. Each of the MAP detectors includes a first MAP unit that generates state metrics by a reverse iteration using first and second reverse Viterbi operators and a forward iteration using a first forward Viterbi operator through portions of the sampled data sequence, and a second MAP unit that generates state metrics by a reverse iteration using third and fourth reverse Viterbi operators and a forward iteration using a second forward Viterbi operator through portions of the sampled data sequence. The first forward Viterbi operator has a different convergence length than the first and second reverse Viterbi operators, and the second forward Viterbi operator has a different convergence length than the third and fourth reverse Viterbi operators. The first and second forward Viterbi operators may have twice the convergence length of first through fourth reverse Viterbi operators.

28 Claims, 7 Drawing Sheets

PARALLEL MAXIMUM A POSTERIORI DETECTORS WITH FORWARD AND REVERSE VITERBI OPERATORS HAVING DIFFERENT CONVERGENCE LENGTHS ON A SAMPLED DATA SEQUENCE

RELATED APPLICATION

This application claims the benefit of and priority to U.S. Provisional Patent Application No. 60/723,131, filed Oct. 3, 2005, the disclosure of which is hereby incorporated herein by reference as if set forth in its entirety.

FIELD OF THE INVENTION

The present invention generally relates to data storage devices and, more particularly, to detectors and methods for generating soft decision values from a sampled data sequence, such as from a read signal in a disk drive.

BACKGROUND OF THE INVENTION

Data storage systems, such as disk drives, need to be able to accurately detect data that has been stored on a storage media. For example, in a magnetic disk drive, data is stored as a coded series (i.e., a binary series) of magnetic transitions on the surface of a magnetic disk. The read signal, formed by reading the magnetic transitions, is often distorted. Some distortion can be deterministic due to geometry of the read head (transducer) and disk, while other distortion can be variable due to the proximity of other magnetic transitions on the disk, localized deformities on the disk, and irregular grain structure on the disk. In addition, noise may be added to the read signal from head resistance, cable parasitics, and electromagnetic interference from other electronics. Collectively, noise and variable distortion tend to obscure the data within the read signal.

To compensate for the occurrence of errors in a read signal, most data storage systems use an encoder to apply error correction coding to the data before it is stored on a media. The read signal is sampled, and a decoder is used to attempt to detect and correct errors in the sampled signal.

A major source of impairments in disk drive magnetic recording channels is the limited bandwidth of the heads and the magnetic disks compared with the data rate which produces inter symbol interference (ISI). The Viterbi detector is a known technique for attempting to remove ISI. The complexity of the Viterbi detector increases exponentially with the length of the ISI, so the Viterbi detector is usually combined with a finite impulse response (FIR) filter. The FIR filter reduces the ISI length by shaping the channel pulse response to some short well-controlled partial response target. The length of the target k is called the constraint length of the (filtered) channel, and $m=k-1$ is the channel memory length, where k is usually less than 5 for manageable complexity of the detector.

An ISI channel with memory length m can be represented by a trellis diagram of 2 m states, each state corresponding to the delayed input bits. Referring to FIGS. 1 and 2, an exemplary trellis of a channel with a partial response target 1-D is shown that has two states, "state 0" and "state 1". Each state is reachable from two previous states and can lead to two different states in response to an input bit (i.e., logic 0 or logic 1). A path through the trellis diagram with N sections (or levels) can define a data block of N bits and which can represent noiseless data read-back from a disk. A Viterbi algorithm uses the trellis diagram of an ISI channel to determine the most likely input sequence by computing the transition probability from each of the states to the next set of states, in view of what is observed or read-back in the presence of channel noise. The probabilities are represented by quantities called metrics. When metrics are defined to be proportional to the negative of the logarithm of the probability, adding of the metrics is equivalent to the reciprocal of the product of the probabilities. Thus, smaller metrics correspond to higher probability events.

Two types of metrics are state metrics, sometimes called path metrics, and branch metrics. A state metric represents the maximum probability that the set of read-back bits leads to the state with which it is associated. A branch metric represents the conditional probability of the read-back bits given that the transition from one state to another occurred.

There are two possible states leading to any given state, each corresponding to the occurrence of a logic 0 or a logic 1 in the highest ordered memory unit of the channel. A detector decides which is the more likely state by an add-compare-select (ACS) operation. Add refers to adding each state metric at the preceding level to the two branch metrics of the branches for the allowable transitions. Compare refers to comparing the pair of such metric sums for paths entering a state (node) at the given level. Select refers to selecting the higher probable one of the two possible states and discarding the other. Thus, only the winning branch is preserved at each node, along with the node state metric. If the two quantities being compared are equal, either branch may be selected, because the probability of an erroneous selection will be the same in either case.

A practical Viterbi detector works on a window size of W, where $W>=C$ and C is the convergence length, which may be 4 to 5 times the memory length of the channel. After the first W trellis sections are processed, the detector compares the 2 m state metrics at the window boundary and the most probable state is selected. A chain back operation is then performed from that state, and the hard decision on the input bit related to the leftmost section can be obtained. Afterwards, the processing window is shifted one section to the right, and the next input bit can be determined in the same manner. It shall be appreciated that each hard decision is made with a fixed lag of W sections for reliable output after sufficient convergence.

A soft detector not only outputs hard decisions, but also outputs soft decision values. The sign of each soft decision value can indicate the hard decision (i.e., logic 0 or logic 1), and the magnitude of the soft decision value can indicate the level of confidence in the hard decision. A soft detector and soft decoder combination utilizes the soft values to improve the system performance.

Soft detection can be computationally intensive and uses more memory than hard detection. For these and other reasons, soft detectors can be difficult to implement in high input/output data bandwidth data storage systems.

The maximum a posteriori (MAP) algorithm is one type of algorithm that generates soft decision values based on a memory system (e.g., an ISI channel, or a convolutional code). As used herein, a "MAP" based detector may include, but not be limited to, logarithm domain type algorithms (referred to as "log-MAP") and min-sum type algorithms. The log-MAP and its simplified versions are not distinguished herein because they can include the same or similar major functional blocks. It is observed that: 1) the MAX function in max-log-MAP is more accurately replaced by MAX* function in log-MAP using a correction term which is usually implemented in a look-up-table; and 2) some differences between the max-log-MAP and the min-sum algorithms are related to the choices of branch metrics, so that the most probable event has the largest path metric in the max-log-MAP algorithms and the smallest in the min-sum algorithms.

SUMMARY OF THE INVENTION

In some embodiments of the present invention, a soft decision value output detector includes a plurality of MAP detectors. The MAP detectors are configured to simultaneously generate state metrics for portions of a sampled data sequence, and to generate soft decision values based on the generated state metrics. Each of the MAP detectors includes a first MAP unit that generates the state metrics by a reverse iteration using a first and second reverse Viterbi operators and a forward iteration using a first forward Viterbi operator through portions of the sampled data sequence, and using a second MAP unit that generates the state metrics by a reverse iteration using third and fourth reverse Viterbi operators and a forward iteration using a second forward Viterbi operator through portions of the sampled data sequence. The first forward Viterbi operator has a different convergence length than the first and second reverse Viterbi operators, and the second forward Viterbi operator has a different convergence length than the third and fourth reverse Viterbi operators.

In some further embodiments, the first forward Viterbi operator has a greater convergence length than the first and second reverse Viterbi operators, and the second forward Viterbi operator has a great convergence length than the third and fourth reverse Viterbi operators. The convergence lengths of the first and second forward Viterbi operators can be about twice the convergence lengths of respective ones of the first through fourth reverse Viterbi operators.

The first forward Viterbi operator and the first reverse Viterbi operator can be configured to converge and output state metrics based on partially overlapped portions of the sampled data sequence. Similarly, the second forward Viterbi operator and the second reverse Viterbi operator can be configured to converge and output state metrics based on partially overlapped portions of the sampled data sequence.

The plurality of MAP detectors can include a number (P) of MAP detectors that is at least as large as a ratio of a rate at which the sampled data sequence is input to the MAP detectors and a rate at which the MAP detectors process the sampled data sequence. Accordingly, the MAP detectors may generate soft decision values in a fixed latency manner and without buffering the sampled data sequence for a whole sector of a disk in a disk drive. The MAP detectors may generate soft decision values for portions of the sampled data sequence at least at a rate at which the portions of the sampled data sequence are input to the MAP detectors.

Some other embodiments of the present invention are directed to related disk drives and methods that generate soft decision values.

DETAILED DESCRIPTION OF THE INVENTION

Figure 1:
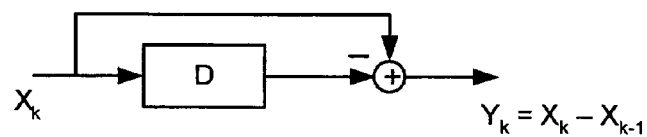
FIG. 1 is a block diagram that represents a conventional ISI channel 1-D, with a memory order of one.
Figure 2:
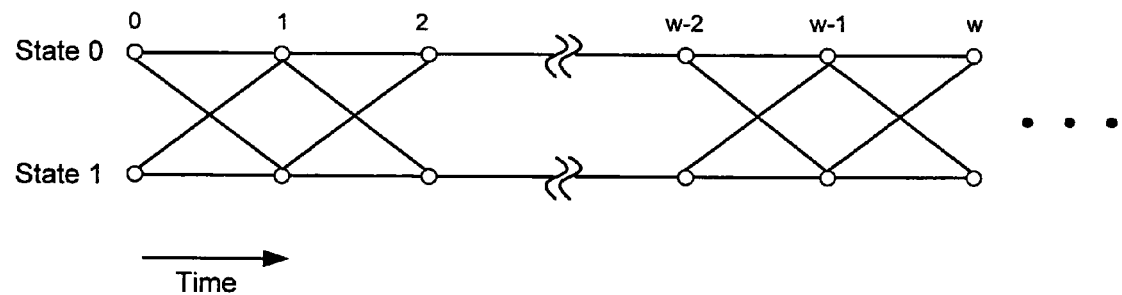
FIG. 2 illustrates a conventional trellis diagram for the channel 1-D of FIG. 1.

The present invention now will be described more fully hereinafter with reference to the accompanying drawings, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the figures and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

It will be understood that, as used herein, the term "comprising" or "comprises" is open-ended, and includes one or more stated elements, steps and/or functions without precluding one or more unstated elements, steps and/or functions. As used herein, the singular forms "a", "an" and "the" are intended to include the plural forms as well, unless the context clearly indicates otherwise. As used herein the terms "and/or" and "/" include any and all combinations of one or more of the associated listed items. It will be understood that, although the terms first, second, etc. may be used herein to describe various elements and/or regions, these elements and/or regions should not be limited by these terms. These terms are only used to distinguish one element/region from another element/region. Thus, a first element/region discussed below could be termed a second element/region without departing from the teachings of the present invention.

The present invention may be embodied in hardware and/or in software (including firmware, resident software, microcode, etc.). Consequently, as used herein, the term "signal" may take the form of a continuous waveform and/or discrete value(s), such as digital value(s) in a memory.

The present invention is described below with reference to block diagrams of disk drives, soft decision value output detectors, and methods according to various embodiments of the invention. It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication/operational paths to show a primary direction of communication/operation, it is to be understood that communication/operational may occur in the opposite direction to the depicted arrows.

Although embodiments of the present invention are described herein in the context of disk drives for purposes of illustration, the present invention is not limited thereto. For example, the detectors and methods described herein may be used in, for example, communication systems, which can include wireless communication systems.

Figure 3:
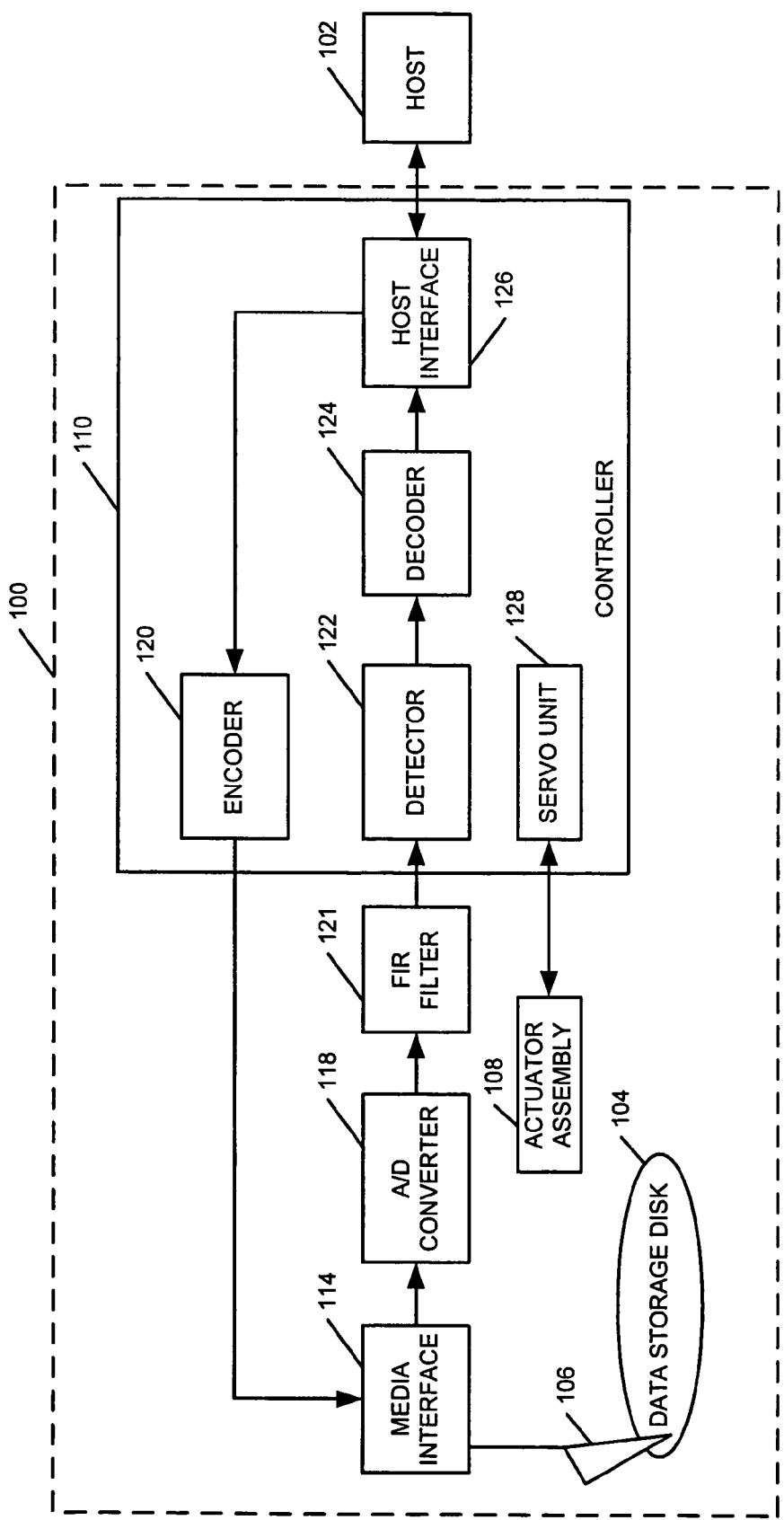
FIG. 3 is a block diagram of representative components of a disk drive in which a detector generates soft decision values in accordance with some embodiments of the present invention.

FIG. 3 illustrates representative components of a disk drive 100 in which detection according to some embodiments of the present invention may be implemented. The disk drive 100 is configured to perform data storage and retrieval functions for an external host computer 102. The disk drive 100 includes: a data storage disk 104, a head 106, an actuator assembly 108, a controller 110, a disk media interface 114, and an analog-to-digital converter 118. The disk 104 may be a magnetic disk, optical disk, or any other type of storage disk, and which may have data storage tracks defined on one or both of its storage surfaces. The disk 104 is rotated while data is read from and written to the tracks. Although only one disk 104 is shown, as is well known in the art, the disk drive 100 may include a plurality of disks mounted to a common spindle, and with each disk accessed by one or more separate heads.

The head 106 may be a magneto-resistive head (MR), or similar device, that is configured to read, and may be further configured to write, data on the data storage disk 104. The head 106 is associated in a "flying" relationship adjacent to a storage surface of the disk 104, where it may be radially positioned by the actuator assembly 108 in order to read and/or write data on a storage surface of the disk 104. The media interface 114 can include amplifiers and other components for conditioning signals that are read from and written to the disk 104 through the head 106.

The controller 110 can include: an encoder 120, a detector 122, a decoder 124, a host interface 126, and a servo unit 128. The host interface 126 is configured to communicate data between the disk drive 100 and the host 102. Although only a single controller 110 is shown in FIG. 3, it is to be understood that the functions thereof may be centralized in a single circuit element, or they may be distributed among more than one circuit element, such as among parallel connected digital signal processors (DSPs) and associated software, parallel connected general purpose processors and associated software, parallel connected application-specific integrated circuits (ASICs), logic gates, analog components and/or a combination thereof. Moreover, the functionality of the detector 122 may be carried out outside of the controller 110, such as within other components in a read-channel of the disk drive 100.

During a write operation, data from the host 102 is encoded by the encoder 120, which may be a convolutional or a block encoder, to form an output data sequence. The output data sequence is conditioned by the media interface 114 and written on the disk 104 via the head 106.

During a read operation, a read signal is formed by the head 106 and conditioned by the media interface 114, and is converted to a sampled data sequence by the A/D converter 118. The A/D converted samples may be further filtered through FIR filter 121 so as to, for example, match the ISI target of length k=m+1, where m is the memory order of the filtered ISI channel. The detector 122 is configured to form soft decision values based on the sampled data sequence using a plurality of parallel connected MAP detectors, such as parallel max-log-MAP detectors, as will be further discussed below. The soft decision values are utilized by the decoder 124 for decoding. The decoder 124 may be, for example, a soft Reed-Solomon decoder or an iterative decoder which may include low density parity check (LDPC) codes or convolutional codes. The decoded data can then be communicated by the host interface 126 to the host 102.

Figure 4:
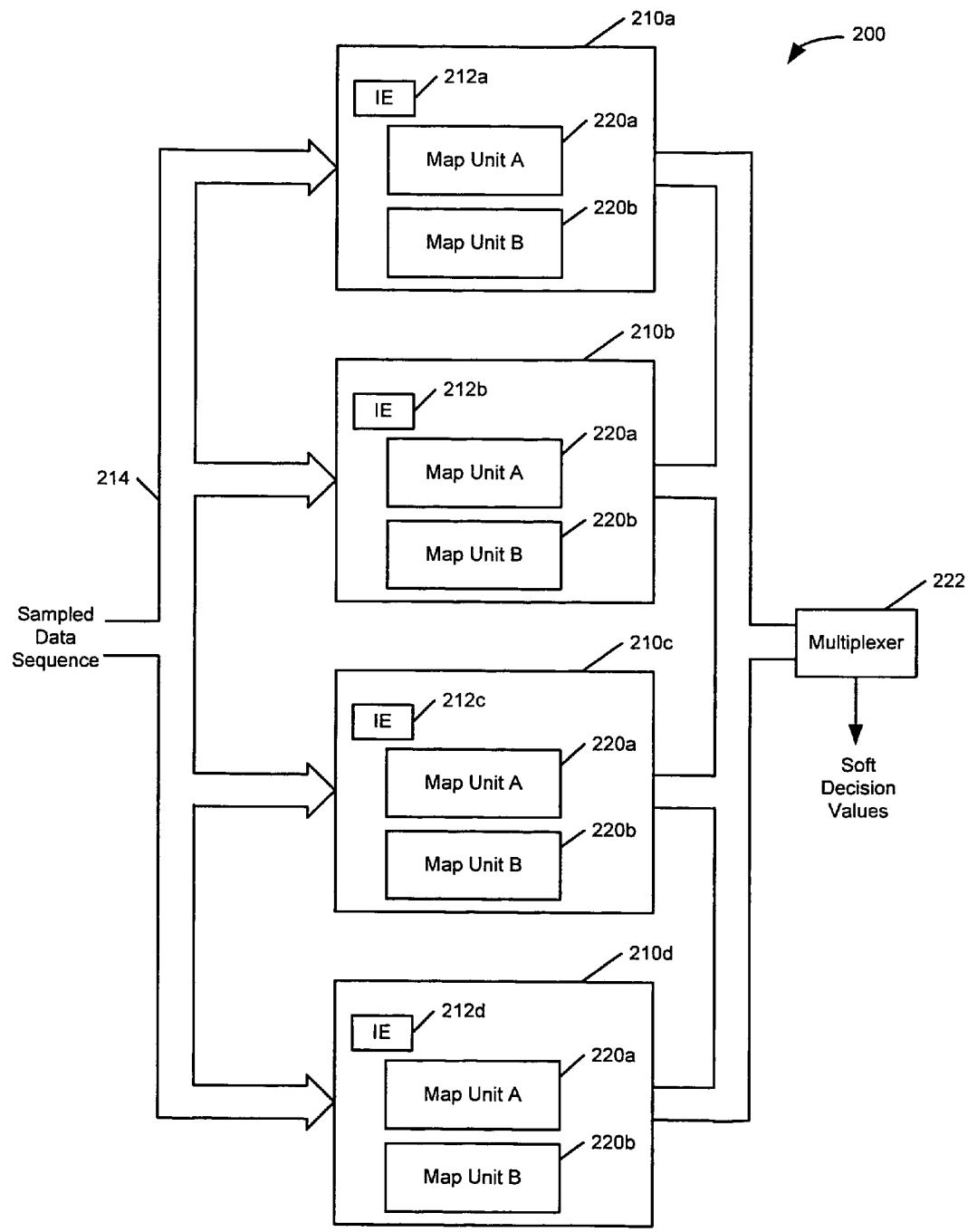
FIG. 4 is a block diagram of a parallel detector that includes a plurality (four as shown) of MAP detectors, each with a pair of MAP units, that generate soft decision values in accordance with some embodiments of the present invention.

Referring now to FIG. 4, a block diagram is shown of an exemplary detector 200 that generates soft decision values based on a sampled data sequence according to some embodiments of the present invention. The detector 200 may be suitable for use as the detector 122 shown in FIG. 3. Each of the soft decision values can include an indication of each encoded data bit and a corresponding level of confidence in the indication. The detector 200 includes a plurality (4 as shown) of parallel connected MAP detectors 210a-d that are configured to simultaneously process portions of a sampled data sequence to generate soft decision values based thereon. For example, during each process cycle (e.g., clock cycle) of the detector 200, the detector 200 may process P sampled data and generate P soft decisions based thereon. The P soft decisions may be generated with a constant latency between input of the sampled data sequence to the detector 200 and the output of the soft decision values.

As used herein, the terms "simultaneous" and "at the same time" when used to describe generation of state metrics for the sampled data sequence, refer to the parallel processing of portions of the data sequence during at least one instant in time, and do not mean the processing must begin or end at the same time. Instead, as will be further explained with reference to some embodiments of the MAP detectors shown in FIGS. 5A-B, individual ones of the MAP detectors 210a-d begin generating state metrics for partially overlapped portions of the data sequence in a staggered manner as sufficient length portions of the data sequence are input to the respective MAP detectors 210a-d, and during at least one instant in time the MAP detectors 210a-d are each generating soft decision values for adjacent portions of the input data sequence.

Different forms of serial MAP detectors and associated algorithms used therein are described in U.S. Pat. No. 5,933,462 and in "VLSI Architectures for the MAP Algorithm", IEEE Transactions on Communications, Vol. 51, No. 2, February 2003, the disclosures of which are hereby incorporated herein by reference as if set forth in their entirety.

A number (P) of MAP detectors 210a-d, called parallelism, may be selected based on (e.g., a ratio of) the rate at which the sampled data sequence is input to the detector 200 and the rate at which each of the MAP detectors 210a-d in the detector 200 can process the sampled data sequence (e.g., cycle frequency of each MAP detector in the detector 200) to generate soft decision values. For example, the number of MAP detectors (P) may be at least as large as the ratio of the input rate and the process rate of each MAP detector. Four MAP detectors 210a-d are shown in FIG. 4, which can operate at a sufficient processing rate so that the sampled data sequence can be processed at the rate at which it is input to the detector 200.

By selecting the number of parallel connected detectors so that soft decision values are generated from the sampled data sequence at the rate at which the sampled data sequence is input into the detector 200, the detector 200 may avoid the need for a relatively large buffer to buffer data that is read from an entire sector of the disk 104 while carrying out soft decision detection. For example, the sampled data sequence that is input to the detector 200 may be buffered to provide a delay of a fixed number of cycles from input to output of the detector 200. Such a buffer may be significantly smaller than a buffer that would be required to store sampled data from an entire sector.

The sampled data sequence is sequentially fed to different ones of the MAP detectors 210a-d via, for example, a parallel bus 214. The MAP detectors 210a-d may be separately loaded with sequential portions of the sampled data sequence by sequentially enabling input enable (IE) logic 212a-d associated with respective ones of the detectors 210a-d.

Each of the MAP detectors 210a-d includes two MAP units, MAP unit A 220a and MAP unit B 220b. Each MAP unit operates over a number of consecutive convergence length portions of the sampled data sequence. Each MAP unit contains one forward Viterbi operator which processes the data sequence in the receive order, and one reverse Viterbi operator which processes the data sequence in a reversely received order.

Some further embodiments of the present invention may arise from a recognition that the size of the memory buffer needed to hold the sampled data sequence while generating soft decision values primarily depends upon the convergence length of the reverse Viterbi operator. For example, the required buffer size can substantially increase as the convergence length of the reverse Viterbi operator is increased. In contrast, the convergence length of the forward Viterbi operator can have substantially less effect relative to the convergence length of the reverse Viterbi operator on the size of the buffer. Reducing the required buffer size may allow a related decrease in the cost of manufacturing the MAP detectors 210a-d. Moreover in some detector applications, for example in disk drives, the forward Viterbi operator can have a greater contribution to accurately detecting bits in read data than the reverse Viterbi operator. Accordingly, increasing the convergence length of the forward Viterbi operator relative to the convergence length of the reverse Viterbi operator may provide increased bit detection accuracy while reducing the required buffer size and associated cost of the MAP detectors.

Accordingly, in accordance with some embodiments of the present invention, the forward Viterbi operator is configured to have a greater convergence length than the reverse Viterbi operator. For example, the convergence length of the forward Viterbi operator can be about twice the convergence length of the reverse Viterbi operator without increasing the latency and storage requirements of the detector. In one exemplary embodiment, the convergence length of the forward Viterbi operator may be about 24 and the convergence length of the reverse Viterbi operator may be about 12.

MAP unit A 220a and MAP unit B 220b can start from an arbitrary set of state metrics, and begin learning over opposite outer portions of consecutive portions of the sampled data sequence (one backward learning and one forward learning). In this manner the MAP units A and B 220a-b can develop reliable state metrics before generating soft decisions, by combining their converged state metrics in the center portion, between the previously learned outer portions of the consecutive convergence length portions of the sampled data sequence. The soft decision values from each of the MAP detectors 210a-d can be multiplexed by a multiplexer 222 to form a sequence of soft decision values that corresponds to the sampled data sequence. An exemplary timing diagram and associated methods of generating state metrics for the sampled data sequence is now described with reference to FIGS. 5A-B.

Figure 5A:
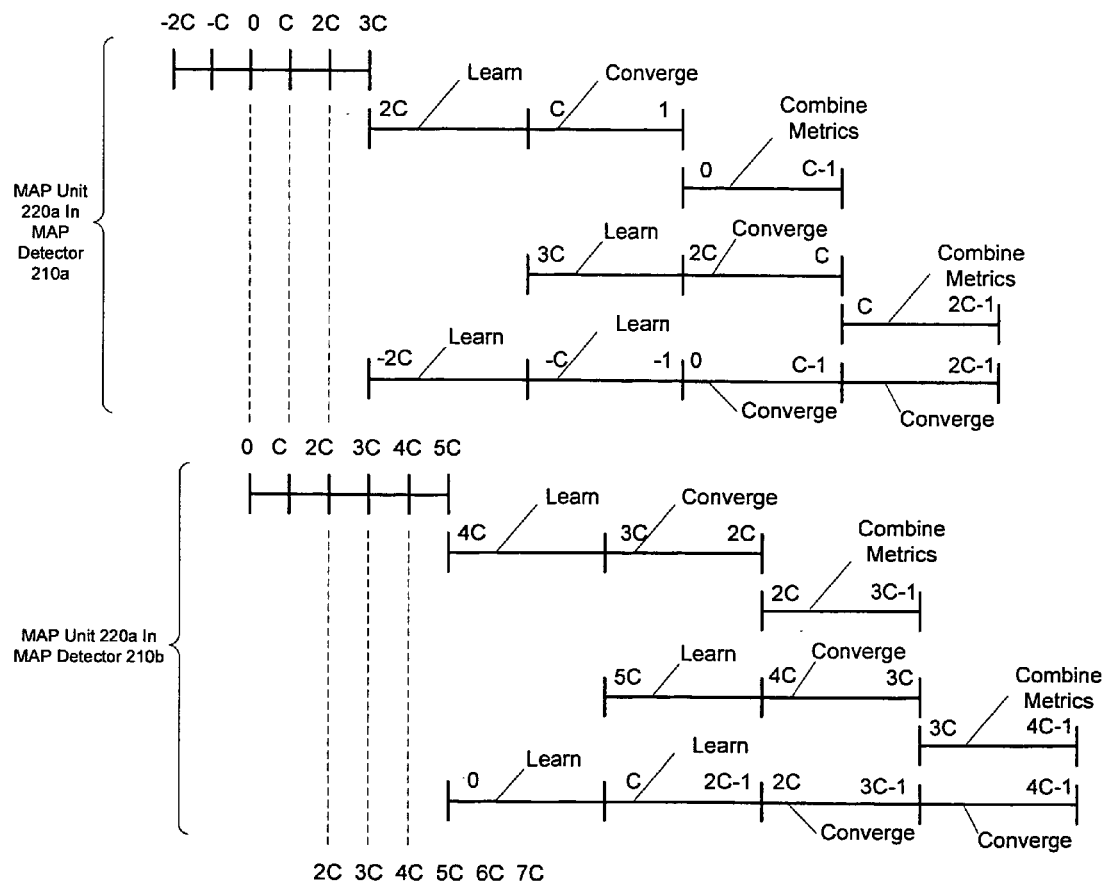
FIGS. 5-B are timing diagrams that illustrate generation of state metrics by MAP units in MAP detectors using forward Viterbi operators having a greater convergence length over a sampled data sequence than reverse Viterbi operators in accordance with some embodiments of the present invention.
Figure 5B:
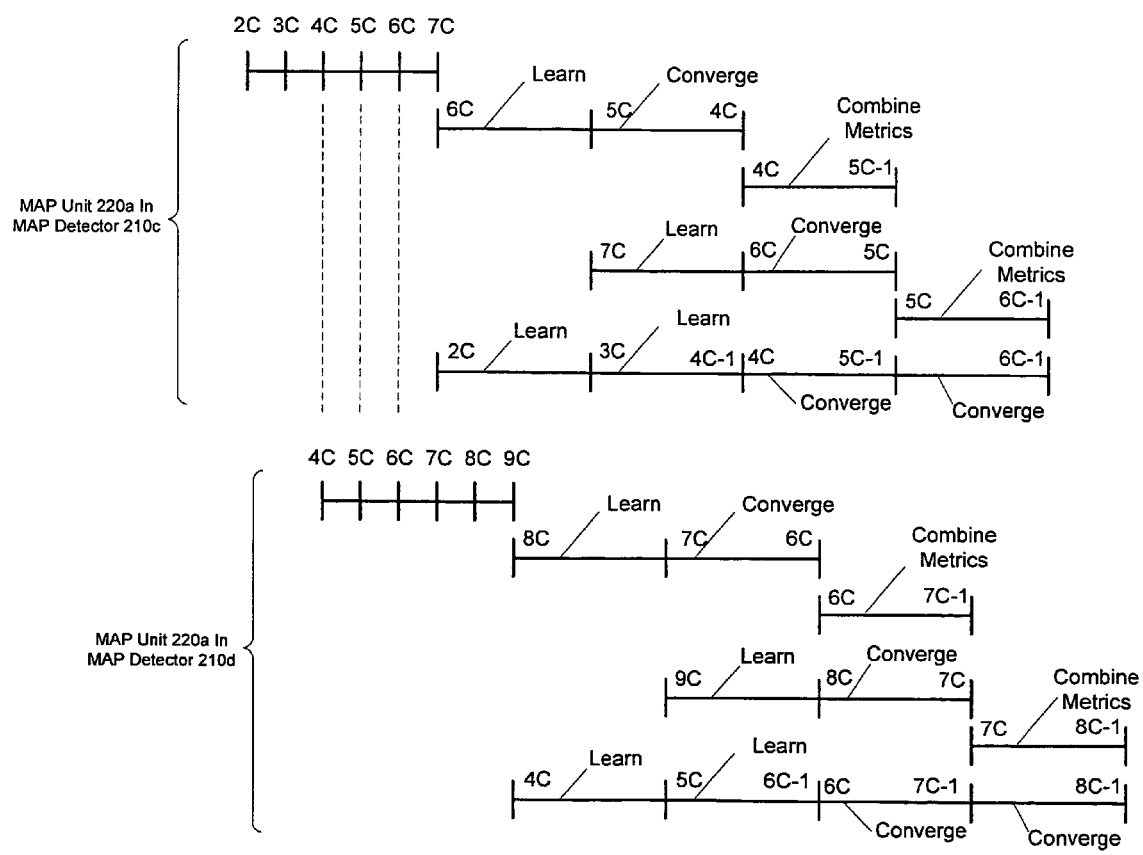

Referring now to FIGS. 5A-B, timing diagrams illustrate the generation of state metrics by MAP unit A 200a in each of the MAP detectors 210a-d for consecutive portions of the sampled data sequence, in accordance with some embodiments of the present invention. The reverse Viterbi operators in each of the MAP units 200a have a convergence length C, which can be based on the target length used by the FIR filter 121 to equalize the sampled data sequence (FIG. 3). In contrast, the forward Viterbi operators in each of the MAP units 200a have a convergence length of 2 C, which is twice the convergence length of the reverse Viterbi operators.

A first MAP unit 220a in MAP detector 210a receives five consecutive portions from −2 C to 3 C of the sampled data sequence. Within the first MAP unit 220a in MAP detector 210a, a reverse Viterbi operator A 408 (FIG. 6b) begins "learning" its state metrics based on the sequence from 2 C to C (i.e., backward learning), and then converges to generate state metrics based on the sequence from C−1 to 0. The metric reversal stack 412 (FIG. 6b) receives the state metrics in the sequence C−1 to 0 and reverses the sequence to 0 to C−1. While converging over the sequence from C−1 to 0, the reverse Viterbi operator A 408 learns over the sequence from 3 C to 2 C and then converges to generate state metrics from the sequence from 2 C−1 to C, and which are again reversed by the metric reversal stack 412. A forward Viterbi operator A 420 (FIG. 6b), in MAP unit 220a of MAP detector 210a, learns over the sequence −2 C to −1 (i.e., forward learning), and then converges to generate state metrics based on the sequence from 0 to 2 C−1. As the forward Viterbi operator A 420 is generating the state metrics for the sequence from 0 to 2 C−1, these state metrics are combined with the state metrics from the metric reversal stack 412 to generate and output soft decision values for sequence C to 2 C−1.

Figure 6A:
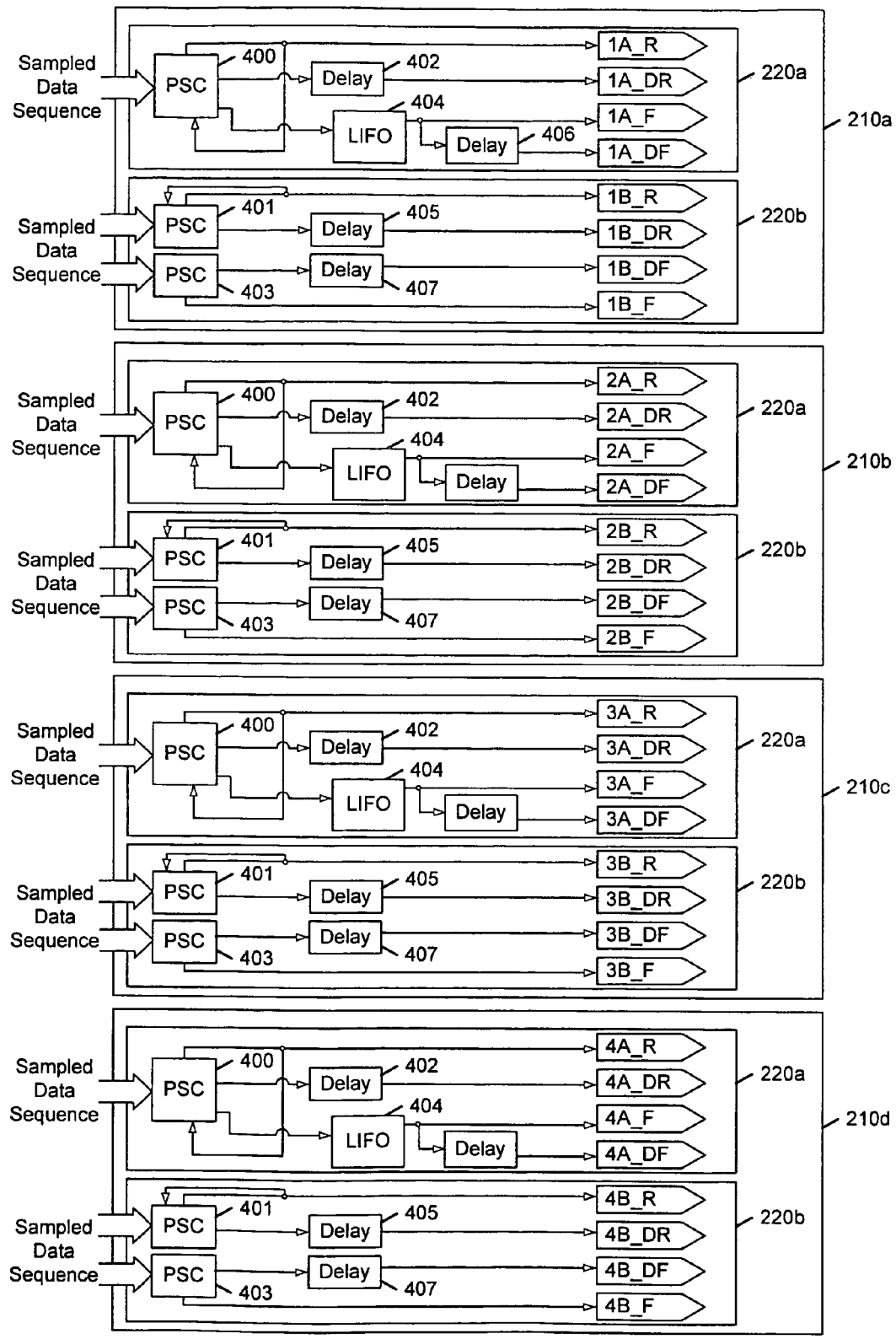
FIGS. 6a-b are a more detailed block diagram of the parallel MAP detectors of FIG. 4, in accordance with some embodiments of the present invention.
Figure 6B:
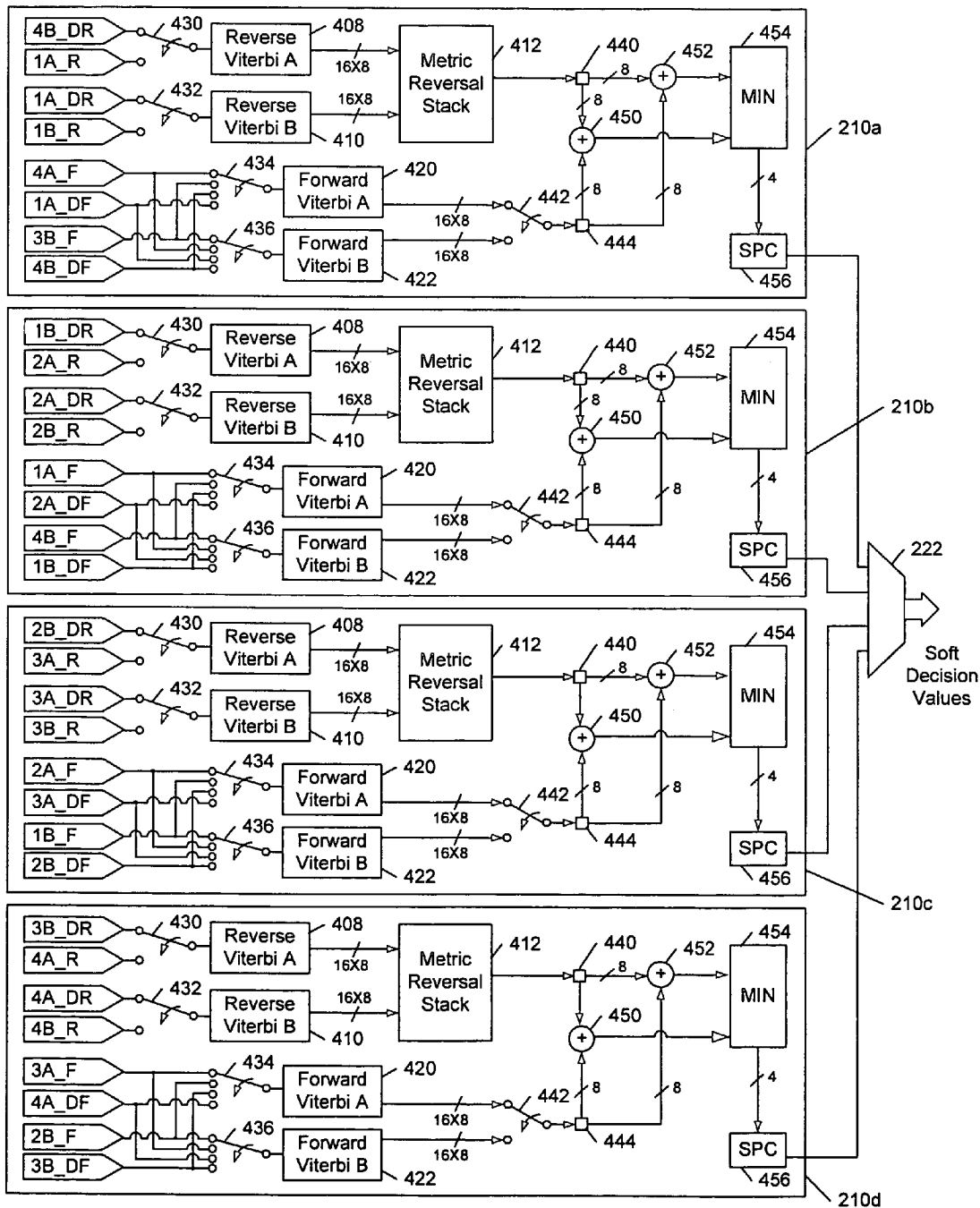

It is further noted that an offset of one sample time is provided between the sampled data sequence processed by the reverse Viterbi operators 408 & 410 (FIG. 6b) and forward Viterbi operators 420 & 422 (FIG. 6b). This offset may allow the use of sample cycles to control transition between metric states. For example, the metrics are combined at a particular state (i), such that sample cycle (i) may be used to transition forward detector 420 from state (i−1) to (i), and sample cycle (i+1) may be used to transition reverse detector 408 from state (i+1) to (i).

At the same time as the first MAP unit 220a in MAP detector 210a is processing the sampled data sequence −2 C to 3 C to generate state metrics, the first MAP unit 220a in MAP detector 210b receives five consecutive portions from 0 to 5 C of the sampled data sequence. Within the first MAP unit 220a in MAP detector 210b, the reverse Viterbi operator A 408 (FIG. 6b) begins learning its state metrics based on the sequence from 4 C to 3 C (i.e., backward learning), and then converges to generate state metrics based on the sequence from 3 C−1 to 2 C. The metric reversal stack 412 receives the state metrics in the sequence 3 C−1 to 2 C and reverses the sequence to 2 C to 3 C—1. While converging over the sequence from 3 C−1 to 2 C, the reverse Viterbi operator A 408 learns over the sequence from 5 C to 4 C and then converges to generate state metrics from the sequence from 4 C to 3 C, and which are again reversed by the metric reversal stack 412. A forward Viterbi operator A 420 (FIG. 6b), in MAP unit 220a of MAP detector 210b, learns over the sequence 0 to 2 C−1 (i.e., forward learning), and then converges to generate state metrics based on the sequence from 2 C to 4 C−1. As the forward Viterbi operator A 420 is generating the state metrics for the sequence from 2 C to 4 C−1, these state metrics are combined with the state metrics from the metric reversal stack 412 to generate and output soft decision values for sequence 3 C to 4 C−1. Accordingly, the first MAP units 220a in MAP detectors 210a and 210b simultaneously generate state metrics based on partially overlapped portions of the sampled data sequence, and with the forward Viterbi operators having twice the convergence lengths of the reverse Viterbi operators.

At the same time as the generation of state metrics by the first MAP unit 220a in MAP detector 210b, the first MAP unit 220a in the third MAP detector 210c receives five consecutive portions from 2 C to 7 C of the sampled data sequence. Within the first MAP unit 220a in the third detector 210c, a reverse Viterbi operator A 408 (FIG. 6b) begins learning its state metrics based on the sequence from 6 C to 5 C (i.e., backward learning), and then converges to generate state metrics based on the sequence from 5 C−1 to 4 C. The metric reversal stack 412 receives the state metrics in the sequence 5 C−1 to 4 C and reverses the sequence to 4 C to 5 C—1. While converging over the sequence from 5 C−1 to 4 C, the reverse Viterbi operator A 408 learns over the sequence from 7 C to 6 C and then converges to generate state metrics from the sequence from 6 C−1 to 5 C, and which are again reversed by the metric reversal stack 412. A forward Viterbi operator A 420 (FIG. 6*b*), in MAP unit 220*a* of MAP detector 210*c*, learns over the sequence 2 C to 4 C−1 (i.e., forward learning), and then converges to generate state metrics based on the sequence from 4 C to 6 C−1. As the forward Viterbi operator A 420 is generating the state metrics for the sequence from 4 C to 6 C−1, these state metrics are combined with the state metrics from the metric reversal stack 412 to generate and output soft decision values for sequence 5 C to 6 C−1.

At the same time as the generation of state metrics by the first MAP unit 220*a* in MAP detector 210*c*, the first MAP unit 220*a* in detector 210*d* receives five consecutive portions from 4 C to 9 C of the sampled data sequence. Within the first MAP unit 220*a* in MAP detector 210*d*, a reverse Viterbi operator A 408 (FIG. 6*b*) begins learning its state metrics based on the sequence from 8 C to 7 C (i.e., backward learning), and then converges to generate state metrics based on the sequence from 7 C−1 to 6 C. The metric reversal stack 412 receives the state metrics in the sequence 7 C−1 to 6 C and reverses the sequence to 6 C to 7 C−1. While converging over the sequence from 7 C−1 to 6 C, the reverse Viterbi operator A 408 learns over the sequence from 9 C to 8 C and then converges to generate state metrics from the sequence from 8 C−1 to 7 C, and which are again reversed by the metric reversal stack 412. A forward Viterbi operator A 420 (FIG. 6*b*), in MAP unit 220*a* of MAP detector 210*d*, learns over the sequence 4 C to 6 C−1 (i.e., forward learning), and then converges to generate state metrics based on the sequence from 6 C to 8 C−1. As the forward Viterbi operator A 420 is generating the state metrics for the sequence from 6 C to 8 C−1, these state metrics are combined with the state metrics from the metric reversal stack 412 to generate and output soft decision values for sequence 7 C to 8 C−1.

Accordingly, as shown in FIGS. 5A-B, the forward Viterbi operators have twice the convergence length over the sampled data sequence compared to the convergence length of the reverse Viterbi operators. Consequently, the MAP units 220*a-b* in each of the MAP detectors 210*a-d* may obtain improved accuracy in generation of the soft decision values from the longer convergence length of the forward Viterbi operators, and may require a smaller buffer size due to the shorter convergence length of the reverse Viterbi operators.

Moreover, as explained with regard to FIGS. 5A-B, the MAP units 220*a* in the MAP detectors 210*a* to 210*d* simultaneously generate state metrics based on partially overlapped portions of the sampled data sequence. Moreover, soft decision values are output with each cycle of the parallel detector 200. While the detector 200 is generating soft output values based on state metrics from MAP units 220*a* in detectors 210*a* to 210*d*, the MAP units 220*b* in detectors 210*a* to 210*d* are learning based on the sampled data sequence. When the detector 200 has finished producing data from the MAP units 220*a*, the MAP units 220*b* in detectors 210*a* to 210*d* are trained and will start converging to generate state metrics for the sample data sequence. The detector 200 may process the sampled data sequence at the rate at which it is input to the detector 200 and, consequently, it may process the input sampled data sequence with a buffer that is substantially smaller than what which would otherwise be needed for processing by a single MAP unit or MAP unit pair. The soft decision values may thereby be generated with a constant latency between when a portion of the sampled data sequence to the detector 200 and when the corresponding soft decision values are generated therefrom.

Reference is now made to FIGS. 6*a-b*, which together form a more detailed block diagram of the parallel detector 200 shown in FIG. 4, in accordance with some embodiments of the present invention. The sampled data sequence is sequentially input to different ones of the MAP detectors 210*a-d* as follows: first sampled data in the sequence is input to forward Viterbi operator A 420 and reverse Viterbi operators A 408 and A 410 within MAP detector 210*a*; second sampled data in the sequence is input to forward Viterbi operator A 420 and reverse Viterbi operators A 408 and A 410 within MAP detector 210*b*; third sampled data in the sequence is input to forward Viterbi operator A 420 and reverse Viterbi operators A 408 and A 410 within MAP detector 210*c*; fourth sampled data in the sequence is input to forward Viterbi operator A 420 and reverse Viterbi operators A 408 and A 410 within MAP detector 210*d*; fifth sampled data in the sequence is input to forward Viterbi operator B 422 and reverse Viterbi operators A 410 and B 410 within MAP detector 210*a*; sixth sampled data in the sequence is input to forward Viterbi operator B 422 and reverse Viterbi operators A 410 and B 410 within MAP detector 210*b*; seventh sampled data in the sequence is input to forward Viterbi operator B 422 and reverse Viterbi operators A 410 and B 410 within MAP detector 210*c*; and eighth sampled data in the sequence is input to forward Viterbi operator B 422 and reverse Viterbi operators A 410 and B 410 within MAP detector 210*d*.

Each of the first MAP units A 220*a* in MAP detectors 210*a-d* includes a first parallel-to-serial converter (PSC) 400, a first delay device 402, a last-in-first-out stack (LIFO) 404, a second delay device 406, a reverse Viterbi operator A 408, a forward Viterbi operator A 420, and the metric reversal stack 412. For purposes of explanation, particular reference is made to MAP unit 220*a* in MAP detector 210*a*, however it is to be understood that the MAP units 220*a-b* in MAP detectors 210*a-d* can all operate in a similar manner. The PSC 400 converts, for example, 16 parallel data samples into a serial data sequence and outputs on line 1A_R (for reverse Viterbi operator A 408 within MAP detector 210*a*) the serial data sequence in a reverse order from the input sequence. The reverse order serial data sequence is delayed by the first delay device 404 to generate a delayed reverse ordered sequence on line 1A_DR (for reverse Viterbi operator B 410 within MAP detector 210*a*). The LIFO stack 404 reverses the order of the data sequence from PSC 400 and outputs on line 1A_F (for forward Viterbi operator A 420 within MAP detector 210*b*) the serial data sequence in a forward order (same order as the input sequence). The forward serial data sequence from LIFO 404 is delayed by the second delay device 406 to generate a delayed forward ordered sequence on line 1A_DF (for forward Viterbi operator A 420 within MAP detector 210*a*).

Each of the second MAP units B 220*b* in detectors 210*a-d* includes a second PSC 401, a third PSC 403, a third delay device 405, a fourth delay device 407, a reverse Viterbi operator B 410, and a forward Viterbi operator B 422, which operate as describe above for the corresponding first PSC 400, first delay device 402, reverse Viterbi operator A 408, and a forward Viterbi operator A 420 of the MAP unit A 220*a* in MAP detectors 210*a-d*.

As shown in FIGS. 6*a-b*, the serial data sequences on lines 1A_R, 1A_DR, 1A_F, 1A_DF, 1B_R, 1B_DR, 1B_F, and 1B_DF originate within MAP detector 210*a*; lines 2A_R, 2A_DR, 2A_F, 2A_DF, 2B_R, 2B_DR, 2B_F, and 2B_DF originate within MAP detector 210*b*; lines 3A_R, 3A_DR, 3A_F, 3A_DF, 3B_R, 3B_DR, 3B_F, and 3B_DF originate within MAP detector 210*c*; lines 4A_R, 4A_DR, 4A_F, 4A_DF, 4B_R, 4B_DR, 4B_F, and 4B_DF originate within MAP detector 210*d*.

The operation of MAP detector 210*a* is further described below, while further discussion of detectors 210*b-d* is omitted for brevity. It is to be understood that MAP detectors 210*b-d* can operate in the same manner as described for MAP detector 210*a*, but with different serial data sequences as shown in FIGS. 5 and 6*a-b*, and as described herein.

In MAP detector 210*a*, reverse Viterbi operator A 408 alternates, as indicated by switch 430, between processing the reverse ordered serial data on lines 4B_DR and 1A_R. Reverse Viterbi operator B 410 alternates, as indicated by switch 432, between processing the reverse ordered serial data on lines 1A_DR and 1B_R. The reverse Viterbi operators A and B, 408 and 410, output their metric values to the metric reversal stack 412, which reverses the order of the metric values back to a forward sequence that corresponds to the input sampled data sequence. The metric values output by the metric reversal stack 412 are split into two groups of, for example 8 metric values, as indicated by splitter 440.

In MAP detector 210*a*, forward Viterbi operator A 420 sequences among four lines using switch 434 in the order of lines 3B_F, 4A_F, 4B_DF, and 1A_DF to generate state metrics. Forward Viterbi operator B 422 sequences among four lines using switch 436 in the order of lines 3B_F, 4A_F, 4B_DF, and 1A_DF to generate state metrics. The metric values from the forward Viterbi operators A and B, 420 and 422, are alternatively collected, as indicated by switch 442, and divided into two groups of, for example 8 metric values, by a splitter 444. One group of the metric values from the forward Viterbi operators A and B, 420 and 422, is combined at summing node 450 with a group of the metric values from the metric reversal stack 412, and input to, for example a minimum (MIN) metric detector for the min-sum algorithm, 454. The other group of the metric values from the forward Viterbi operators A and B, 420 and 422, is combined at summing node 452 with the other group of the metric values from the metric reversal stack 412, and input to the minimum metric detector 454. The minimum metric detector 454 identifies the minimum metric values in both groups of inputted metric values, and generates a soft decision value based on a difference between the identified minimum metric values. The soft decision value is output to a serial to parallel converter (SPC) 456, which outputs parallel soft decision values.

The soft decision values from the serial to parallel converter 456 of each of the MAP detectors 210*a-d* are provided to the multiplexer 222, which outputs a sequence of soft decision values that corresponds to the input sampled data sequence.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A soft decision value output detector comprising:
   a plurality of maximum a posteriori (MAP) detectors configured to simultaneously generate state metrics for portions of a sampled data sequence, and to generate soft decision values based on the generated state metrics, wherein each of the MAP detectors comprises:
   a first MAP unit that is configured to generate the state metrics by a reverse iteration using first and second reverse Viterbi operators and a forward iteration using a first forward Viterbi operator through portions of the sampled data sequence, wherein the first forward Viterbi operator has a different convergence length than the first and second reverse Viterbi operators; and
   a second MAP unit that is configured to generate the state metrics by a reverse iteration using third and fourth reverse Viterbi operators and a forward iteration using a second forward Viterbi operator through portions of the sampled data sequence, wherein the second forward Viterbi operator has a different convergence length than the third and fourth reverse Viterbi operators.

2. The soft decision value output detector of claim 1, wherein:
   the first MAP unit is further configured so that the convergence length of the first forward Viterbi operator is greater than the convergence length of the first and second reverse Viterbi operators; and
   the second MAP unit is further configured so that the convergence length of the second forward Viterbi operator is greater than the convergence length of the third and fourth reverse Viterbi operators.

3. The soft decision value output detector of claim 2, wherein:
   the first MAP unit is further configured so that the convergence length of the first forward Viterbi operator is twice the convergence length of the first and second reverse Viterbi operators; and
   the second MAP unit is further configured so that the convergence length of the second forward Viterbi operator is about twice the convergence length of the third and fourth reverse Viterbi operators.

4. The soft decision value output detector of claim 3, wherein:
   the first MAP unit is further configured so that the convergence length of the first forward Viterbi operator is about 24 and the convergence length of the first and second reverse Viterbi operators are about 12; and
   the second MAP unit is further configured so that the convergence length of the second forward Viterbi operator is about 24 and the convergence length of the third and fourth reverse Viterbi operators are about 12.

5. The soft decision value output detector of claim 1, wherein:
   the first forward Viterbi operator and the first and second reverse Viterbi operators are configured to converge and output state metrics based on partially overlapped portions of the sampled data sequence; and
   the second forward Viterbi operator and the third and fourth reverse Viterbi operators are configured to converge and output state metrics based on partially overlapped portions of the sampled data sequence.

6. The soft decision value output detector of claim 5, wherein each MAP detector comprises a metric reversal stack that is configured to reverse order of the state metrics from the first and second reverse Viterbi operators.

7. The soft decision value output detector of claim 1, wherein the plurality of MAP detectors comprises a number (P) of MAP detectors that is at least as large as a ratio of a rate at which the sampled data sequence is input to the MAP detectors and a rate at which the MAP detectors process the sampled data sequence.

8. The soft decision value output detector of claim 1, wherein each of the MAP detectors is configured to combine state metrics that are output from the forward and reverse Viterbi operators in the first and second MAP units to generate soft decision values.

9. The soft decision value output detector of claim 1, wherein the MAP detectors are configured to simultaneously generate state metrics for partially overlapped multiple convergence length portions of the sampled data sequence.

10. The soft decision value output detector of claim 1, wherein each of the MAP detectors is configured to generate soft decision values for a portion of the sampled data sequence that is adjacent to a portion of the sampled data sequence for which another one of the MAP detectors generates soft decision values.

11. The soft decision value output detector of claim 10, wherein, within each of the MAP detectors, the first MAP unit is configured to generate soft decision values for a first portion of the sampled data sequence that is immediately adjacent to a second portion of the sampled data sequence for which the second MAP detector generates soft decision values.

12. The soft decision value output detector of claim 1, wherein:
the plurality of MAP detectors are configured to generate soft decision values for sequential portions of the sampled data sequence.

13. The soft decision value output detector of claim 12, wherein:
the plurality of MAP detectors comprise four MAP detectors;
the first MAP detector is configured to generate soft decision values for a first portion of the sampled data sequence;
the second MAP detector is configured to generate soft decision values for a second portion of the sampled data sequence that is immediately adjacent to the first portion of the sampled data sequence;
the third MAP detector is configured to generate soft decision values for a third portion of the sampled data sequence that is immediately adjacent to the second portion of the sampled data sequence; and
the fourth MAP detector is configured to generate soft decision values for a fourth portion of the sampled data sequence that is immediately adjacent to the third portion of the sampled data sequence.

14. The soft decision value output detector of claim 13, wherein:
the plurality of MAP detectors are configured to generate soft decision values about one convergence length sample time after another one of the MAP detectors generates soft decision values.

15. The soft decision value output detector of claim 1, wherein the plurality of MAP detectors are configured to generate soft decision values for portions of the sampled data sequence at least at a rate at which the portions of the sampled data sequence are input to the MAP detectors.

16. The soft decision value output detector of claim 1, wherein the sampled data sequence is based on a read signal of data recorded on a disk in a disk drive.

17. A disk drive comprising:
a disk that is configured to store data;
a head that is configured to read data from the disk to generate a read signal;
an analog-to-digital converter that is configured to generate a sampled data sequence from the read signal; and
a plurality of maximum a posteriori (MAP) detectors configured to simultaneously generate state metrics for portions of the sampled data sequence, and to generate soft decision values based on the generated state metrics, wherein each of the MAP detectors comprises:

a first MAP unit that is configured to generate the state metrics by a reverse iteration using first and second reverse Viterbi operators and a forward iteration using a first forward Viterbi operator through portions of the sampled data sequence, wherein the first forward Viterbi operator has a different convergence length than the first and second reverse Viterbi operators; and
a second MAP unit that is configured to generate the state metrics by a reverse iteration using third and fourth reverse Viterbi operators and a forward iteration using a second forward Viterbi operator through portions of the sampled data sequence, wherein the second forward Viterbi operator has a different convergence length than the third and fourth reverse Viterbi operators.

18. The disk drive of claim 17, wherein:
the first MAP unit is further configured so that the convergence length of the first forward Viterbi operator is greater than the convergence length of the first and second reverse Viterbi operators; and
the second MAP unit is further configured so that the convergence length of the second forward Viterbi operator is greater than the convergence length of the third and fourth reverse Viterbi operators.

19. The disk drive of claim 18, wherein:
the first MAP unit is further configured so that the convergence length of the first forward Viterbi operator is twice the convergence length of the first and second reverse Viterbi operators; and
the second MAP unit is further configured so that the convergence length of the second forward Viterbi operator is about twice the convergence length of the third and fourth reverse Viterbi operators.

20. The disk drive of claim 19, wherein:
the first MAP unit is further configured so that the convergence length of the first forward Viterbi operator is about 24 and the convergence length of the first and second reverse Viterbi operators are about 12; and
the second MAP unit is further configured so that the convergence length of the second forward Viterbi operator is about 24 and the convergence length of the third and fourth reverse Viterbi operators are about 12.

21. The disk drive of claim 17, wherein:
the plurality of MAP detectors comprise four MAP detectors;
the first MAP detector is configured to generate soft decision values for a first portion of the sampled data sequence;
the second MAP detector is configured to generate soft decision values for a second portion of the sampled data sequence that is immediately adjacent to the first portion of the sampled data sequence;
the third MAP detector is configured to generate soft decision values for a third portion of the sampled data sequence that is immediately adjacent to the second portion of the sampled data sequence; and
the fourth MAP detector is configured to generate soft decision values for a fourth portion of the sampled data sequence that is immediately adjacent to the third portion of the sampled data sequence.

22. The disk drive of claim 17, wherein the MAP detectors are configured to simultaneously generate soft decision values for a plurality of adjacent convergence length portions of the sampled data sequence.

23. A method of generating soft decision values based on a sampled data sequence, the method comprising:
generating state metrics using a plurality of maximum a posteriori (MAP) detectors, each of the MAP detectors comprising a first MAP unit generating the state metrics by a reverse iteration using first and second reverse Viterbi operators and a first forward iteration using a forward Viterbi operator through portions of the sampled data sequence and with the first forward Viterbi operator having a different convergence length than the first and second reverse Viterbi operators, and a second MAP unit generating the state metrics by a reverse iteration using third and fourth reverse Viterbi operators and a forward iteration using a second forward Viterbi operator through portions of the sampled data sequence and with the second forward Viterbi operator having a different convergence length than the third and fourth reverse Viterbi operators; and generating soft decision values based on the state metrics from the plurality of MAP detectors.

24. The method of claim 23, wherein the first forward Viterbi operator has a greater convergence length than the first and second reverse Viterbi operators, and the second forward Viterbi operator has a greater convergence length than the third and fourth reverse Viterbi operators.

25. The method of claim 24, wherein the first forward Viterbi operator has a convergence length about twice the convergence length of the first and second reverse Viterbi operators, and the second forward Viterbi operator has a convergence length about twice the convergence length of the third and fourth reverse Viterbi operators.

26. The method of claim 23, wherein generating soft decision values using a plurality of maximum a posteriori (MAP) detectors comprises:

generating soft decision values from a first one of the MAP detectors for a first portion of the sampled data sequence;

generating soft decision values from a second one of the MAP detectors for a second portion of the sampled data sequence that is immediately adjacent to the first portion of the sampled data sequence;

generating soft decision values from a third one of the MAP detectors for a third portion of the sampled data sequence that is immediately adjacent to the second portion of the sampled data sequence;

generating soft decision values from a fourth one of the MAP detectors for a fourth portion of the sampled data sequence that is immediately adjacent to the third portion of the sampled data sequence.

27. The method of claim 23, wherein generating state metrics using a plurality of maximum a posteriori (MAP) detectors comprises:

operating the reverse and the forward Viterbi operators of the first MAP unit at a same time to reverse iterate and forward iterate through a portion of the sampled data sequence to generate the state metrics through a learning mode and a converging mode; and operating the reverse and the forward Viterbi operators of the second MAP unit at a same time to reverse iterate and forward iterate through portions of the sampled data sequence to generate the state metrics through a learning mode and a converging mode, wherein the second MAP unit is operated at a same time as the first MAP unit.

28. The method of claim 23, wherein generating soft decision values based on the state metrics from the plurality of MAP detectors comprises generating the soft decision values for portions of the sampled data sequence at least at a rate at which the portions of the sampled data sequence are input to the MAP detectors.

* * * * *